United States Patent [19]
Bartur

[11] Patent Number: 5,184,198
[45] Date of Patent: Feb. 2, 1993

[54] SPECIAL GEOMETRY SCHOTTKY DIODE

[75] Inventor: Meir Bartur, Brentwood, Calif.

[73] Assignee: Solid State Devices, Inc., La Mirada, Calif.

[21] Appl. No.: 714,341

[22] Filed: Jun. 12, 1991

Related U.S. Application Data

[63] Continuation of Ser. No. 566,237, Aug. 15, 1990, abandoned.

[51] Int. Cl.$^5$ .................. H01L 29/48; H01L 23/48
[52] U.S. Cl. .................. 257/471; 257/486; 257/773
[58] Field of Search .................. 357/15, 68, 71

[56] References Cited

U.S. PATENT DOCUMENTS

| | | | |
|---|---|---|---|
| 4,901,120 | 2/1990 | Weaver et al. | 357/15 |
| 4,982,260 | 1/1991 | Chang et al. | 357/15 |
| 5,027,166 | 6/1991 | Ohtsuka et al. | 357/15 |

OTHER PUBLICATIONS

R. U. Martinelli et al., "The Effects of Storage Time Variations on the Forward Resistance of Silicon P+—n—n+ Diodes at Microwave Frequencies", IEEE Trans. on Elec. Dev., vol. ED-27, No. 9, pp. 1728-1732, 1980.

Robert H. Kingston, "Switching Time in Junction Diodes and Junction Transistors", Proceedings of the I-R-E, pp. 829-834; 1954.

Sze, "Minority Carrier Injection Ratio", Solid State Electronics 8, pp. 390-393; 1965.

*Primary Examiner*—Mark V. Prenty
*Attorney, Agent, or Firm*—Spensley Horn Jubas & Lubitz

[57] ABSTRACT

Schottky barrier diode comprises a Schottky contact layer having an increased periphery to area ratio. In the illustrated embodiment, the Schottky contact layer comprises a plurality of individual contact regions interconnected by an overlying metallization layer.

13 Claims, 2 Drawing Sheets

SPECIAL GEOMETRY SCHOTTKY DIODE

This is a continuation of application Ser. No. 566,237 filed on Aug. 15, 1990, now abandoned.

BACKGROUND OF THE INVENTION

1. Field of the Invention

The present invention relates to Schottky barrier diodes, and more particularly, to such diodes having fast switching times.

2. Description of Related Art

A Schottky diode comprises a semiconductor substrate and a metal contact layer deposited on the substrate to form a Schottky barrier at the metal-semiconductor interface. A Schottky diode is primarily a majority carrier device. That is, under many circumstances (primarily low injection conditions), current is conducted primarily by majority carriers. As a consequence, Schottky diodes often have faster switching times than p-n junction diodes of comparable size. Nonetheless, for some applications, it is desirable to increase the speed of Schottky diodes even further.

SUMMARY OF THE INVENTION

It is an object of the present invention to provide an improved Schottky barrier diode, obviating, for practical purposes, the above-mentioned limitations, particularly in a manner requiring a relatively uncomplicated design.

These and other objects and advantages are achieved by, in accordance with a preferred embodiment of the present invention, a Schottky barrier diode comprising a Schottky contact layer having an increased periphery to area ratio. As a consequence, it is believed that the switching speed of the Schottky diode will be increased over many prior Schottky diodes of comparable size.

In one embodiment, the Schottky contact layer comprises a plurality of small round disks which are interconnected by an overlying metallization layer. Such an arrangement has a total periphery greatly in excess of that of a single disk of comparable area. Other embodiments include a sun burst shaped Schottky contact layer comprising a central disk and a plurality of rays extending from the central disk.

DETAILED DESCRIPTION OF THE INVENTION

Figure 1:
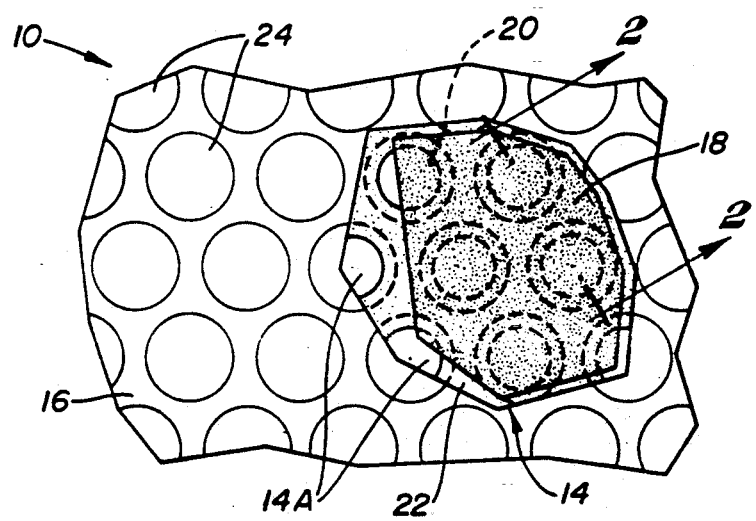
FIG. 1 is a top view of a Schottky barrier diode in accordance with a preferred embodiment of the present invention, a portion of the metallization and insulation layers being removed for purposes of clarity.
Figure 2:
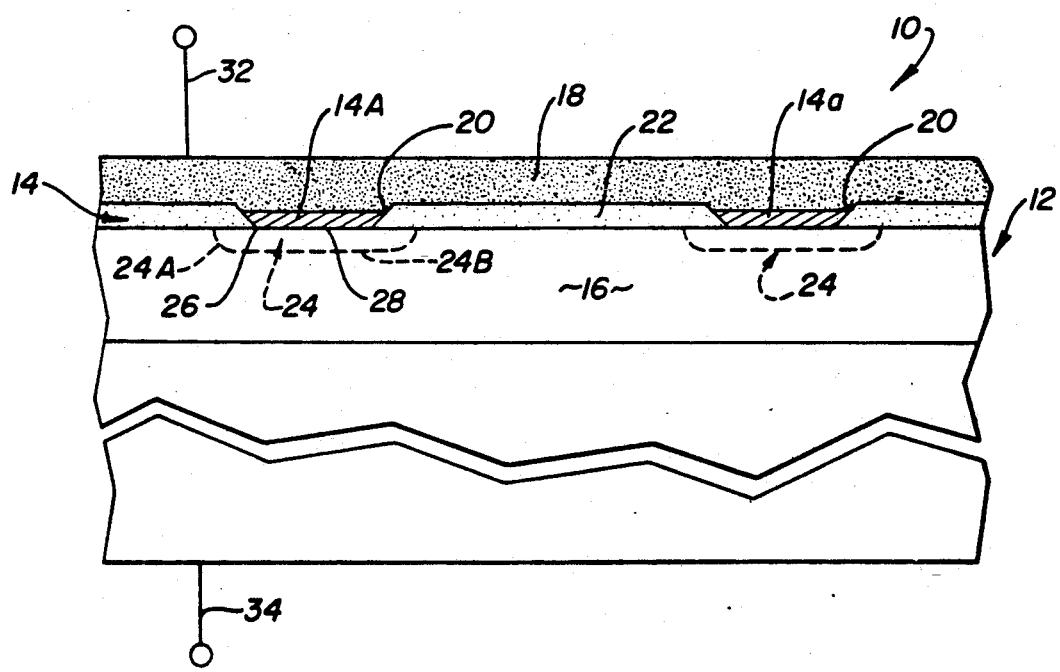
FIG. 2 is a cross-sectional view of the diode of FIG. 1, as viewed along the lines 2—2 of FIG. 1.

A power Schottky barrier diode in accordance with a preferred embodiment of the invention is indicated generally at 10 in FIGS. 1 and 2. Although the diode 10 is depicted as a power diode designed to operate at currents in excess of 100 milliamps, it is recognized that the present invention is applicable to non-power diodes as well. The diode 10 includes a semiconductor substrate 12 and a Schottky contact layer 14 formed on an epitaxial layer 16 of the substrate 12. As will be explained in greater detail below, the Schottky contact layer 14 has an increased periphery to area ratio which is believed to increase the switching speed of the device.

As best seen in FIG. 1, the contact layer 14 comprises a plurality of individual disk-shaped regions 14A which are interconnected by an overlying metallization layer 18. Each individual contact region 14A is contacted by the metallization layer 18 through an aperture 20 (FIG. 2) formed in an intervening insulation layer 22 in the central portion of each contact region 14A. Optionally, a diffusion barrier layer such as TiN, Ti-W or Ta-Si-N (as described in E. Kolawa et al., "Amorphous Ta-Si-N thin-film alloys as diffusion barrier in Al/Si metallizations", *Journal of Vacuum Science and Technology A*, Vol. 813, May-June 1990; pp. 3006–3010) may be interposed between the metallization layer 18 and each contact region 14A to prevent contamination of the contact region by the metallization layer.

Each Schottky contact region 14A induces a depletion region 24 in the underlying epitaxial layer 16 adjacent the contact region. Each depletion region 24 has a generally curved portion 24A opposite the edge 26 of the adjacent metal contact region 14A. Each depletion region 24 further includes a generally flattened portion 24B opposite the generally planar central portion 28 of the associated Schottky contact region 14A.

The diode 10 has an anode terminal 32 coupled to the metallization layer 18 and a cathode terminal 34 coupled to the bottom of the substrate 12. Consequently, current flows generally vertically through the diode 10.

As previously mentioned, Schottky barrier diodes are generally thought of as majority carrier devices. Thus, if the substrate 12 is formed from n-type semiconductor material, the majority carriers would be electrons. A forward biasing voltage applied across the terminals 32, 34 causes the electrons to drift from the substrate 12 under the influence of the applied electric field, and to be subsequently collected by the Schottky contact layer 14. Because a Schottky device is primarily a majority carrier device, the device can turn off very rapidly should the applied electric field be reversed. However, in a Schottky diode there is nonetheless some minority carrier injection from the Schottky contact layer into the semiconductor substrate. It is the presence of these injected minority carriers which to a large extent, slows down the switching speed of a Schottky diode. Minority carrier injection becomes more pronounced as the forward biasing increases.

In accordance with the present invention, it has been recognized that the switching speed of a Schottky barrier diode may be improved by increasing the effective periphery of the Schottky contact layer for a given contact area. This may be understood by referring back to FIG. 2 and noting the curved portions 24A of the depletion regions adjacent the peripheries 26 of each Schottky contact region 14A. It is believed that the total stored charge of minority carriers in the curved portions 24A is significantly smaller per unit area for the same current density than that of minority carriers injected into the generally planar portions 24B. Consequently, by maximizing the peripheral areas and minimizing the planar areas of the contact layer 13, it is believed that the switching speed of the device can be significantly increased, particularly in high voltage applications. High voltage applications often require thicker epitaxial layers, which in effect increase the amount of minority carriers injected.

For example, one hundred Schottky contact regions 14A with a radius of R/10 would have a combined area equal to that of a single circular Schottky contact region of radius R, yet would have ten times the total periphery of the single Schottky contact region of radius R. Hence, it is believed that the Schottky device 10 of the present invention would have a faster switching speed than a Schottky diode having a single large circular contact region.

Figure 3:
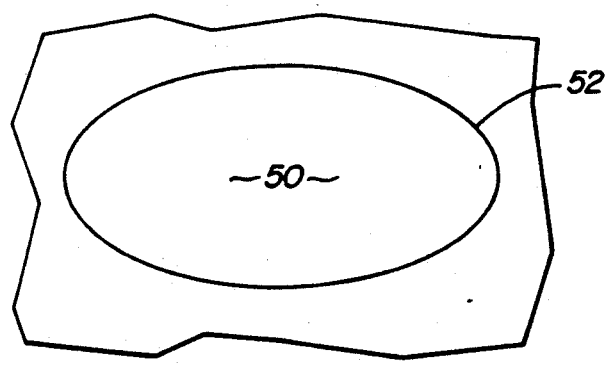
FIG. 3 is a top view of a Schottky contact layer in accordance with an alternative embodiment of the present invention.

In addition to breaking up a single large contact region into many interconnected smaller contact regions, the total periphery of the contact layer may be increased by elongating the shape of the contact region. For example, FIG. 3 shows an oblong-shaped contact layer 50 which has a longer periphery 52 than a circular Schottky contact layer of comparable size. It should be appreciated that the techniques of FIGS. 1 and 3 can be combined so that each of the small contact region 14A of FIG. 1 would have an oblong periphery rather than a circular periphery.

Figure 4:
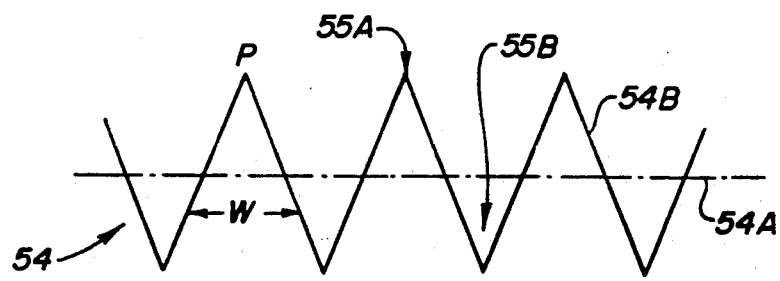
FIG. 4 is a closer view of the periphery of a Schottky contact layer in accordance with another embodiment of the present invention.

Referring now to FIG. 4, another technique for increasing the length of the Schottky contact layer periphery is illustrated. FIG. 4 shows a close-up of a portion 54 of a Schottky contact region periphery. Instead of a relatively smooth peripheral shape as indicated in phantom at 54A, the periphery 54 has convex areas 55A alternating with concave areas 55B. More specifically, the periphery 54 has a linear saw-tooth shape as indicated at 54B. A simple saw-tooth shape as shown in FIG. 4 can effectively double the total periphery of the single contact region 50 of FIG. 3.

Figure 5:
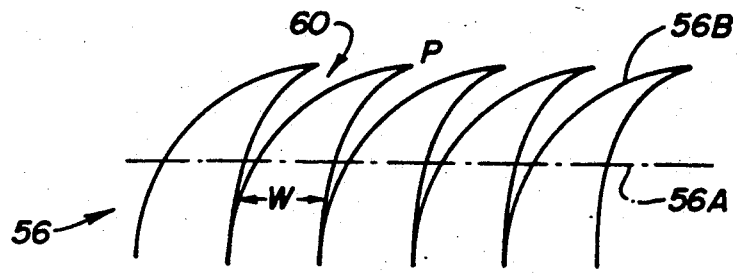
FIG. 5 is a closer view of a periphery of a Schottky contact layer in accordance with yet another embodiment of the present invention.

A somewhat more area efficient peripheral shape is shown in FIG. 5. There, a periphery 56 has a curved sawtooth shape 56B which leaves less unused substrate surface area 60 between the individual "teeth" of the periphery 56B. In both the peripheries 54 and 56 of FIGS. 4 and 5, respectively, individual teeth of the peripheries increase in width W from the termination point P at the end of each tooth to the base of each tooth. By increasing the width of each tooth in this manner, the increase in the surface resistance to the collected current caused by narrowing of the current path should be reduced.

Figure 6:
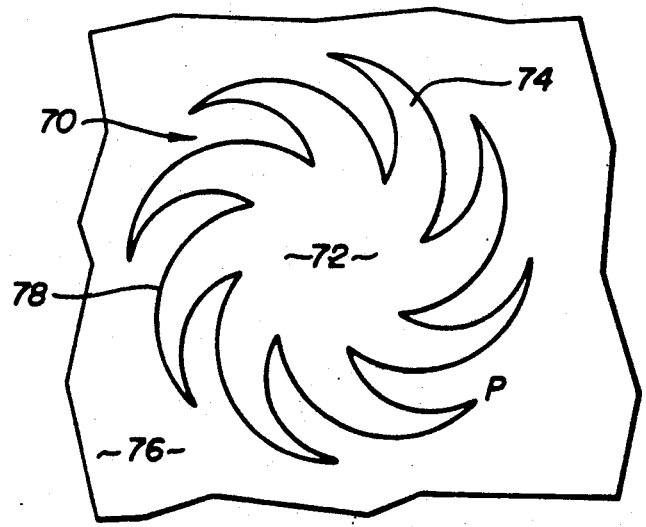
FIG. 6 is a top view of a Schottky contact layer in accordance with a further embodiment of the present invention.

FIG. 6 shows yet another embodiment of the present invention. As shown therein, a contact region 70 has a generally "sun-burst" shape comprising a central portion 72 and a plurality of rays 74 extending radially from the central portion 72. As in the periphery 56 of FIG. 5, each rays 74 terminates in a single point P. In addition, the rays 74 are curved to efficiently utilize the substrate surface area 76. By comparing FIG. 6 to FIG. 3, it can be appreciated that the total length of the periphery 78 of the star-burst contact region 72 is significantly greater than the periphery 52 for an oblong-shaped contact region 50 of comparable area. Thus, it is expected that the switching speed of a Schottky diode incorporating a Schottky contact region as shown in FIG. 6 would be significantly faster than a Schottky diode employing a more circular-shaped Schottky contact region. Here too, the saw-tooth shaped peripheries of FIG. 4 or FIG. 5 may be substituted for the smooth periphery 78 depicted in FIG. 6 to further increase the total periphery of the contact region. Still further, a saw-tooth shaped periphery can be substituted for the smooth peripheries of each individual tooth of the saw-tooth shaped peripheries of FIGS. 4 and 5. This process may be repeated to the maximum resolution of the available masking techniques.

Thus, it can be seen from the above that by increasing the total periphery of the Schottky contact layer, an improved switching speed of the diode may be obtained.

In the preferred embodiment, the diode does not have any guard rings. It is believed that guard rings could lessen the effectiveness of the novel structures for increasing switching speed. However, it is recognized that there may be some applications for which guard rings would nonetheless be desired.

It will, of course, be understood that modifications of the present invention, in its various aspects, will be apparent to those skilled in the art, some being apparent only after studying, others being matters of routine semiconductor fabrication and design. For example, a variety of shapes may be substituted for the shapes explicitly described above. For example, Schottky contact regions may have serpentine shapes, spiral shapes, digitated shapes, and the like to increase the total periphery of the contact region over that normally found with circular and square Schottky contact regions. Other embodiments are also possible, their specific designs depending upon the particular application. As such, the scope of the invention should not be limited by the particular embodiments herein described but should be defined only by the appended claims and equivalents thereto.

What is claimed is:
1. A Schottky barrier diode, comprising:
a substrate having a plurality of sides;
a Schottky metal contact layer in contact with a first side of the substrate to form said Schottky barrier diode, said Schottky metal contact layer comprising a plurality of individual Schottky contact regions;
a first conductor electrically coupled to each of the Schottky contact regions;
a second conductor electrically coupled to a second side of the substrate; and
wherein each Schottky contact region is circular-shaped.

2. A Schottky barrier diode, comprising:
a substrate having a plurality of sides;
a Schottky metal contact layer in contact with a first side of the substrate to form said Schottky barrier diode, said Schottky metal contact layer comprising a plurality of individual Schottky contact regions;
a first conductor electrically coupled to each of the Schottky contact regions;
a second conductor electrically coupled to a second side of the substrate; and
wherein each Schottky contact region is sunburst-shaped.

3. A Schottky barrier diode, comprising:
a substrate having a plurality of sides;

a Schottky metal contact layer in contact with a first side of the substrate to form said Schottky barrier diode, said Schottky metal contact layer comprising a plurality of individual Schottky contact regions;

a first conductor electrically coupled to each of the Schottky contact regions;

a second conductor electrically coupled to a second side of the substrate; and wherein each Schottky contact region has a saw-toothed shaped periphery.

4. A Schottky barrier diode, comprising:

a substrate having a plurality of sides;

a Schottky metal contact layer in contact with a first side of the substrate to form said Schottky barrier diode, said Schottky metal contact layer comprising a plurality of individual Schottky contact regions;

a first conductor electrically coupled to each of the Schottky contact regions;

a second conductor electrically coupled to a second side of the substrate; and wherein a portion of the periphery of each Schottky contact region has a concave segment.

5. A Schottky barrier diode, comprising:

a substrate having a plurality of sides;

a Schottky metal contact layer in contact with a first side of the substrate to form said Schottky barrier diode, said Schottky metal contact layer comprising a Schottky contact region having a periphery wherein a portion of the Schottky contact region periphery has a concave segment;

a first conductor electrically coupled to the Schottky contact region; and a second conductor electrically coupled to a second side of the substrate.

6. A power Schottky barrier diode, comprising:

an n-type semiconductor substrate having an epitaxial layer on a first side of the substrate;

a Schottky metal contact region in contact with the epitaxial layer to form said power Schottky barrier diode, said Schottky metal contact region having a generally oblong shape;

a first conductor electrically coupled to the Schottky metal contact region; and a second conductor electrically coupled to a second side of the substrate, wherein the periphery of the Schottky contact region has a saw-tooth shape.

7. A power Schottky barrier diode, comprising:

an n-type semiconductor substrate having an epitaxial layer on a first side of the substrate;

a Schottky metal contact region in contact with the epitaxial layer to form said power Schottky barrier diode, said Schottky metal contact region having a generally sunburst shape which defines a plurality of rays;

a first conductor electrically coupled to the Schottky metal contact region; and a second conductor electrically coupled to a second side of the substrate, wherein the diode is designed to operate at currents in excess of 100 milliamps.

8. The diode of claim 7 wherein the periphery of the Schottky metal contact region has a saw-tooth shape.

9. The diode of claim 7 wherein the sunburst-shape Schottky metal contact region comprises a central portion and a plurality of rays extending from the central portion, each ray terminating in a point.

10. The diode of claim 7 wherein each ray is curved.

11. The diode of claim 7 further comprising a plurality of said sunburst-shaped contact regions to define a plurality of Schottky metal contact regions, said first conductor being electrically coupled to each Schottky contact region.

12. A Schottky barrier diode, comprising:

a substrate having a plurality of sides;

a Schottky metal contact layer in contact with a first side of the substrate to form said Schottky barrier diode, said Schottky metal contact layer comprising a plurality of individual Schottky contact regions;

a first conductor electrically coupled to each of the Schottky contact regions;

a second conductor electrically coupled to a second side of the substrate; and wherein each Schottky contact region is oval-shaped.

13. The diode of claim 12 wherein the diode is a power diode designed to operate at currents in excess of 100 milliamps.

* * * * *